(12) United States Patent
Miura et al.

(10) Patent No.: US 6,191,972 B1
(45) Date of Patent: Feb. 20, 2001

(54) MAGNETIC RANDOM ACCESS MEMORY CIRCUIT

(75) Inventors: Sadahiko Miura; Hideaki Numata, both of Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/563,751

(22) Filed: May 1, 2000

(30) Foreign Application Priority Data

Apr. 30, 1999 (JP) .................................................. 11-124765
Apr. 30, 1999 (JP) .................................................. 11-124766

(51) Int. Cl.[7] .................................................. G11C 11/14
(52) U.S. Cl. .......................... 365/171; 365/158; 365/175; 365/189.08
(58) Field of Search .................................. 365/171, 158, 365/189.08, 175

(56) References Cited

U.S. PATENT DOCUMENTS

| | | | |
|---|---|---|---|
| 5,173,873 | * 12/1992 | Wu et al. | 365/173 |
| 5,329,480 | * 7/1994 | Wu et al. | 365/170 |
| 5,640,343 | 6/1997 | Gallagher et al. | 365/171 |
| 5,699,293 | * 12/1997 | Tehrani et al. | 365/158 |
| 5,748,519 | 5/1998 | Tehrani et al. | 365/98 |
| 5,852,574 | * 12/1998 | Naji | 365/158 |
| 6,055,179 | * 4/2000 | Koganei et al. | 365/158 |

* cited by examiner

Primary Examiner—Richard Elms
Assistant Examiner—Tuan T. Nguyen
(74) Attorney, Agent, or Firm—McGinn & Gibb, PLLC

(57) ABSTRACT

A magnetic random access memory circuit comprises first and second row decoders receiving a part of a given address, first and second column decoders receiving the other part of a given address, a plurality of pairs of sense lines connected between output terminals of the first row decoder and output terminals of the second row decoder, each pair of sense lines being located adjacent to each other, a plurality of word lines connected between output terminals of the first column decoder and output terminals of the second column decoder, and extending to intersect the sense lines so that intersections of the sense lines and the word lines are located in the form of a matrix. A memory array includes a plurality of cell pairs distributed over the matrix, each cell pair including a memory cell and a reference cell located adjacent to each other. Each of the memory cell and the reference cell includes a magneto-resistive element. The memory cell and the reference cell of each cell pair are located at intersections of one word line and one pair of sense lines, respectively. The memory cell of the each cell pair is connected between one sense line of the one pair of sense lines and the one word line, and the reference cell of the each cell pair is connected between the other sense line of the one pair of sense lines and the one word line.

20 Claims, 7 Drawing Sheets

MAGNETIC RANDOM ACCESS MEMORY CIRCUIT

BACKGROUND OF THE INVENTION

The present invention relates to a magnetic random access memory circuit (called a "MRAM circuit" in this specification).

A magnetic random access memory includes a plurality of memory cells located at intersections of word lines and bit lines, each memory cell being basically constituted of a pair of ferromagnetic layers separated by an insulating or non-magnetic metal layer. Digital information is represented by the direction of magnetic vectors in the ferromagnetic layers, and is infinitely maintained unless it is intentionally rewritten. In order to write or change the state of the memory cell, a composite magnetic field which is generated by use of a word current and a bit current and which is larger than a threshold, is applied to the memory cell, so as to reverse the magnetization of the ferromagnetic layers.

A first example of the magnetic random access memory includes a number of memory cells configured to utilize a giant magneto-resistive (GMR) effect, as disclosed by U.S. Pat. No. 5,748,519 and IEEE Transaction On Components Packaging and Manufacturing Technology—Part A Vol. 170, No. 3, pp373–379 (the content of which are incorporated by reference in its entirety into this application). Referring to FIG. 1, there is shown a layout diagram of a simplified MRAM circuit including each memory cell configured to utilize the GMR effect. As shown in FIG. 1, the MRAM circuit includes a memory array divided into a first array portion 604 and a second array portion 605, a decoder consisting of a row decoder 602 and a column decoder 603, and a comparator 606. The row decoder 602 and the column decoder 603 are connected to an address bus 601, respectively. In a reading operation, one of the first array portion 604 and the second array portion 605 is used as a reference cell.

In this first prior art example, separate word lines are required for a memory cell and a reference cell, respectively, and a memory cell array and a reference cell array are separated or put apart from each other. Therefore, a reference signal is inclined to contain a parasite component, with the result that it is difficult to have a sufficient margin in operation. Accordingly, a high level of equality in characteristics is required for memory cells on the same wafer. In addition, since the separate word lines are required for a memory cell and a reference cell, respectively, and since the memory cell array and the reference cell array are separated apart from each other, a memory cell area is large, so that it is difficult to elevate the integration density for microminiaturization.

Furthermore, in this first prior art example, since two cells (one included in the first array portion 604 and another included in the second array portion 605) are required for one address, a memory cell area is large, so that it is difficult to elevate the integration density for microminiaturization.

A second example of the magnetic random access memory includes a number of memory cells configured to utilize a magnetic tunnel junction (MTJ) effect, as disclosed by U.S. Pat. No. 5,640,343 (the content of which is incorporated by reference in its entirety into this application). Referring to FIG. 2, there is shown a MRAM circuit including each memory cell configured to utilize the MTJ effect. The shown MRAM circuit includes row decoders 701 and 702, column decoders 703 and 704, and a matrix circuit having a number of MTJ elements 711 to 715 and so on located at intersections of word lines 705, 706 and 707 extending between the row decoders 701 and 702 and bit lines 708, 709 and 710 extending between the column decoders 703 and 704. In this MRAM circuit, a stored information is distinguished dependent upon whether a sense current is large or small. However, this patent does not disclose a method for detecting the magnitude (large or small) of the sense current, nor does it show how to connect a comparator (sense amplifier).

BRIEF SUMMARY OF THE INVENTION

Accordingly, it is an object of the present invention to provide an MRAM circuit which has overcome the above mentioned problems of the prior art.

Another object of the present invention is to provide an MRAM circuit having a characteristics which does not depend upon variation in characteristics of magneto-resistive elements depending upon a geographical location on the same wafer.

Still another object of the present invention is to provide an MRAM circuit capable of reading at high sensitivity while excluding influence of a wiring resistance to the utmost.

A further object of the present invention is to provide an MRAM circuit having a circuit construction effective for integration.

The above and other objects of the present invention are achieved in accordance with the present invention by a magnetic random access memory circuit comprising:

a row decoding means receiving a part of a given address;

a column decoding means receiving the other part of a given address;

a plurality of pairs of sense lines connected to output terminals of the row decoding means, each pair of sense lines being located adjacent to each other;

a plurality of word lines connected to output terminals of the column decoding means, the word lines extending to intersect the sense lines so that intersections of the sense lines and the word lines are located in the form of a matrix;

a memory array including a plurality of cell pairs distributed over the matrix, each cell pair including a memory cell and a reference cell located adjacent to each other, each of the memory cell and the reference cell including a magneto-resistive element;

the memory cell and the reference cell of each cell pair being located at intersections of one word line and one pair of sense lines, respectively, the memory cell of the each cell pair being connected between one sense line of the one pair of sense lines and the one word line, and the reference cell of the each cell pair being connected between the other sense line of the one pair of sense lines and the one word line.

In a specific embodiment of the magnetic random access memory circuit, the row decoding means includes a pair of row decoders each receiving the part of a given address, and the column decoding means includes a pair of column decoders each receiving the other part of a given address, each of the sense lines being connected between one output of plural outputs of one row decoder of the pair of row decoders and a corresponding output of plural outputs of the other row decoder of the pair of row decoders, each of the word lines being connected between one output of plural outputs of one column decoder of the pair of column decoders and a corresponding output of plural outputs of the other column decoder of the pair of column decoders.

In a writing operation, the pair of row decoders supply one selected pair of sense lines with an electric current which flows in a direction corresponding to the value of a binary information to be written, and the pair of column decoders supply an electric current of a predetermined direction regardless of the value of the binary information to be written, in a selected word line of the word lines.

On the other hand, in a reading operation, the row decoding means and the column decoding means flow the same current in the memory cell and the reference cell of a selected cell pair to be read out.

In a preferred embodiment, the magnetic random access memory circuit further includes a comparing means for comparing a potential at a sense line side terminal of the memory cell of the selected cell pair with a potential of a sense line side terminal of the reference cell of the selected cell pair.

Specifically, the comparing means includes a comparator having a non-inverted input and an inverted input, first and second subsidiary lines connected to the non-inverted input and the inverted input of the comparator, respectively, a plurality of first switch transistors each having one end connected in common to the first subsidiary line and the other end connected to one sense line of a corresponding one pair of sense lines, and a plurality of second switch transistors each having one end connected in common to the second subsidiary line and the other end connected to the other sense line of the corresponding one pair of sense lines, the plurality of first switch transistors and the plurality of second switch transistors being on-off controlled by the row decoding means.

Alternatively, the magnetic random access memory circuit further includes a first means for flowing a current in the memory cell and the reference cell of a selected cell pair in a reading operation, and a second means for comparing a voltage drop in the memory cell of the selected cell pair with a voltage drop of the reference cell of the selected cell pair.

According to a second aspect of the present invention, there is provided a magnetic random access memory circuit comprising:

a row decoding means receiving a part of a given address;

a column decoding means receiving the other part of a given address;

a plurality of sense lines connected to output terminals of the row decoding means;

a plurality of word lines connected to output terminals of the column decoding means, the word lines extending to intersect the sense lines so that intersections of the sense lines and the word lines are located in the form of a matrix;

a memory array including a plurality of memory cells and a plurality of reference cells distributed over the matrix and located the intersections of the sense lines and the word lines, the plurality of reference cells being located along at least one predetermined sense line of the sense lines and connected at its one end in common to the at least one predetermined sense line and at its other end to the word lines, respectively, the plurality of memory cells being located along the other sense lines of the sense lines, the memory cells located along each sense line of the other sense lines being connected at its one end in common to the each sense line and at its other end to the word lines, respectively, each of the memory cells and the reference cells including a magneto-resistive element.

In a specific embodiment of the magnetic random access memory circuit, the row decoding means includes a pair of row decoders each receiving the part of a given address, and the column decoding means includes a pair of column decoders each receiving the other part of a given address, each of the sense lines being connected between one output of plural outputs of one row decoder of the pair of row decoders and a corresponding output of plural outputs of the other row decoder of the pair of row decoders, each of the word lines being connected between one output of plural outputs of one column decoder of the pair of column decoders and a corresponding output of plural outputs of the other column decoder of the pair of column decoders.

In a writing operation, the pair of row decoders supply a selected sense line of the sense lines with an electric current which flows in a direction corresponding to the value of a binary information to be written, and the pair of column decoders supply an electric current of a predetermined direction regardless of the value of the binary information to be written, in a selected word line of the word lines.

On the other hand, in a reading operation, the row decoding means and the column decoding means flow the same current in a selected memory cell at an interconnection of a selected one of the sense lines other than the at least one predetermined sense line and a selected one of the word lines, and a selected reference cell at an interconnection of the at least one predetermined sense line of the sense lines and the selected one of the word lines.

In a preferred embodiment, the magnetic random access memory circuit further includes a comparing means for comparing a potential at a sense line side terminal of the selected memory cell with a potential of a sense line side terminal of the selected reference cell.

Specifically, the comparing means includes a comparator having a non-inverted input and an inverted input, first and second subsidiary lines connected to the non-inverted input and the inverted input of the comparator, respectively, a plurality of first switch transistors each having one end connected in common to the first subsidiary line and the other end connected to a corresponding one of the sense lines other than the at least one predetermined sense line, and at least one second switch transistor having one end connected to the second subsidiary line and the other end connected to the at least one predetermined sense line, the plurality of first switch transistors and the at least one second switch transistor being on-off controlled by the row decoding means.

Alternatively, the magnetic random access memory circuit further includes a first means for flowing a current in a selected memory cell at an interconnection of a selected one of the sense lines other than the at least one predetermined sense line and a selected one of the word lines, and a selected reference cell at an interconnection of the at least one predetermined sense line of the sense lines and the selected one of the word lines, and a second means for comparing a voltage drop in the selected memory cell with a voltage drop of the selected reference cell.

In the respective magnetic random access memory circuits in accordance with the first and second aspects of the present invention, each of the memory cell and the reference cell can include a diode connected in series to the magneto-resistive element, one end of a series circuit formed of the diode and the magneto-resistive element being connected to a corresponding sense line, and the other end of the series circuit formed of the diode and the magneto-resistive element being connected to a corresponding word line.

Alternatively, in the respective magnetic random access memory circuits in accordance with the first and second aspects of the present invention, each of the memory cell and the reference cell can include a pass transistor connected in series to the magneto-resistive element, one end of a series circuit formed of the pass transistor and the magneto-resistive element being connected to a corresponding sense line, and the other end of the series circuit formed of the pass transistor and the magneto-resistive element being connected to a corresponding word line, the pass transistor being on-off controlled by the row decoding means.

The above mentioned magneto-resistive element can be constituted of a spin-polarized tunneling element.

The above and other objects, features and advantages of the present invention will be apparent from the following description of preferred embodiments of the invention with reference to the accompanying drawings.

DETAILED DESCRIPTION OF THE INVENTION

First Embodiment

Figure 3:
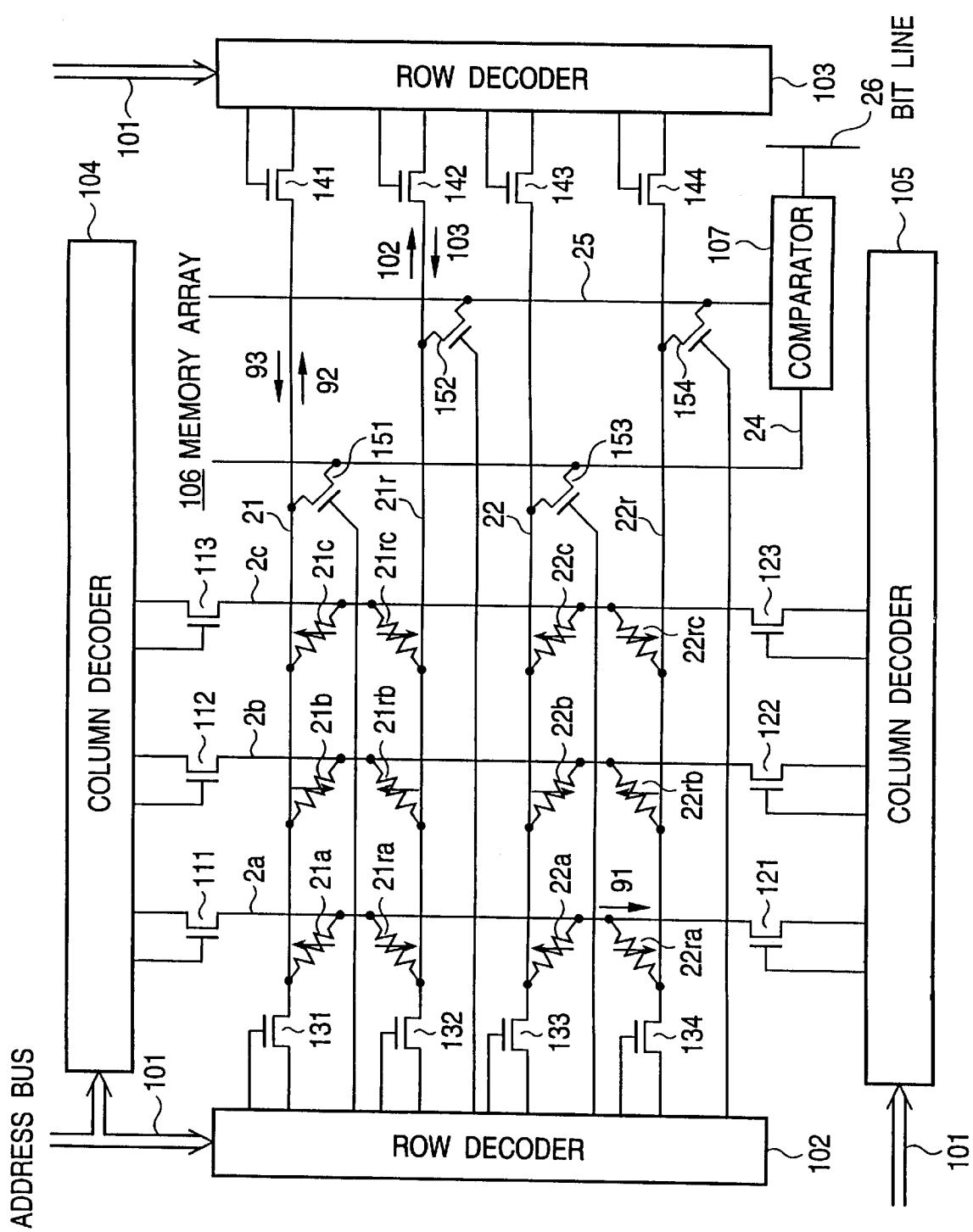
FIG. 3 is a layout diagram of a first embodiment of the MRAM circuit in accordance with the present invention.

Referring to FIG. 3, there is shown a layout diagram of a first embodiment of the MRAM circuit in accordance with the present invention.

The shown MRAM circuit includes a memory (cell) array 106, a decoder set and a comparator 107. The memory array 106 includes a number of memory cells 21a, 21b, 21c, 22a, 22b and 22c, and a number of reference cells 21ra, 21rb, 21rc, 22ra, 22rb and 22rc which are paired with the number of memory cells, respectively. The memory cells and the reference cells are located at intersections of word lines 2a, 2b and 2c and sense lines 21, 21r, 22 and 22r.

The decoder set includes a pair of row decoders 102 and 103 and a pair of column decoders 104 and 105, which are coupled to an address bus 101 in such a manner that each of the row decoders 102 and 103 receives and decodes a first part of an address supplied through the address bus 101, and each of the column decoders 104 and 105 receives and decodes a second part (namely, the remaining part) of the address supplied through the address bus 101.

The column decoder 104 includes switch transistors 111, 112 and 113, and the column decoder 105 includes switch transistors 121, 122 and 123. In brief, current terminals of the column decoder 104 are connected to one end of the switch transistors 111, 112 and 113, respectively, the other end of which are connected to one end of the word lines 2a, 2b and 2c, respectively. A control gate of the switch transistors 111, 112 and 113 are connected to control outputs of the column decoder 104, respectively. Furthermore, current terminals of the column decoder 105 are connected to one end of the switch transistors 121, 122 and 123, respectively, the other end of which are connected to the other end of the word lines 2a, 2b and 2c, respectively. A control gate of the switch transistors 121, 122 and 123 are connected to control outputs of the column decoder 105, respectively. Thus, these column decoders decode the first part of the address supplied through the address bus, and on-off control these switch transistors 111, 112, 113, 121, 122 and 123, on the basis of the result of the decoding, so as to selectively bring the word lines 2a, 2b and 2c into either a writing condition or a ground level condition. In the writing condition, an electric current is caused to flow through the selected word line in a direction of the arrow 91.

The row decoder 102 includes switch transistors 131, 132, 133 and 134, and the row decoder 103 includes switch transistors 141, 142, 143 and 144. In brief, current terminals of the row decoder 102 are connected to one end of the switch transistors 131, 132, 133 and 134, respectively, the other end of which are connected to one end of the sense lines 21, 21r, 22 and 22r, respectively. A control gate of the switch transistors 131, 132, 133 and 134 are connected to control outputs of the row decoder 102, respectively. Furthermore, current terminals of the row decoder 103 are connected to one end of the switch transistors 141, 142, 143 and 144, respectively, the other end of which are connected to the other end of the sense lines 21, 21r, 22 and 22r, respectively. A control gate of the switch transistors 141, 142, 143 and 144 are connected to control outputs of the row decoder 103, respectively. Thus, these row decoders decode the second part of the address supplied through the address bus, and on-off control these switch transistors 131, 132, 133, 134, 141, 142, 143 and 144 on the basis of the result of the decoding, so as to selectively bring the sense lines 21, 21r, 22 and 22r into either a writing condition or a ground level condition. In the writing condition, opposite direction electric currents are caused to flow through the selected one pair of sense lines either in the opposite directions of the arrows 92 and 103 or in the opposite direction of the arrows 93 and 102.

One end of a subsidiary line (sense line) 24 is connected through pass transistors 151 and 153 to the sense lines 21 and 22, respectively. The other end of the subsidiary line (sense line) 24 is connected to a non-inverted input of the comparator 107. One end of another subsidiary line (sense line) 25 is connected through pass transistors 152 and 154 to the sense lines 21r and 22r, respectively. The other end of the subsidiary line (sense line) 25 is connected to an inverted input of the comparator 107. A control gate of these pass transistors 151, 152, 153 and 154 are connected to control terminals of the row decoder 102, so that the pass transistors 151, 152, 153 and 154 are selectively on-off controlled by the row decoder 102.

As mentioned above, the cells given with the reference numbers 21a, 21b, 21c, 22a, 22b and 22c, are the memory cells, and the cells given with the reference numbers 21ra, 21rb, 21rc, 22ra, 22rb and 22rc, are the reference cells. As shown in the drawing, since the reference cell is located geographically adjacent to the memory cell which is to paired to the reference cell, it is possible to minimize influence of variation in a wiring resistance depending upon a geographical location on the same wafer. Furthermore, in the shown MRAM circuit, one bit of information is stored in two spin-polarized tunneling elements (one memory cell and one reference cell), so that an S/N ratio of the memory cell can be elevated, and a common-mode noise rejection can be obtained.

Figure 4A:
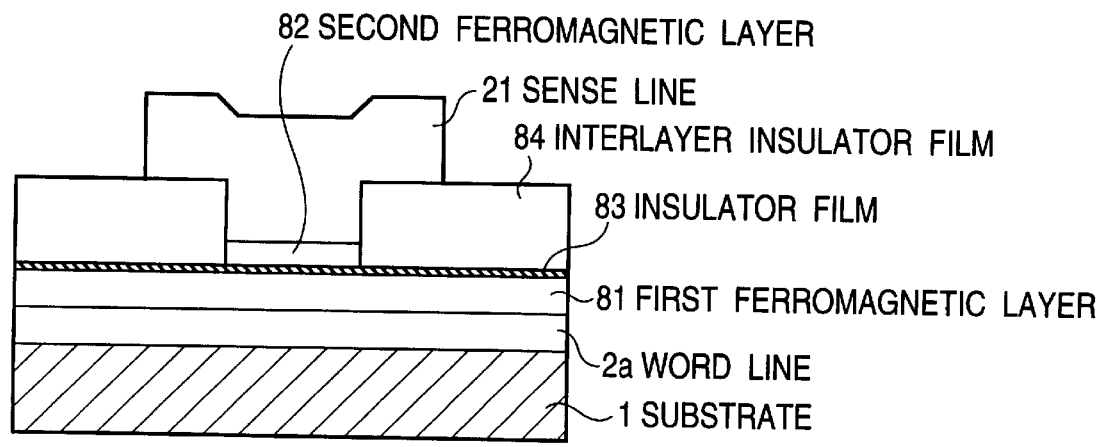
FIGS. 4A and 4B are a diagrammatic sectional view and a diagrammatic plan view of a magneto-resistive element which is used as a memory cell and a reference cell in the MRAM circuit in accordance with the present invention.
Figure 4B:
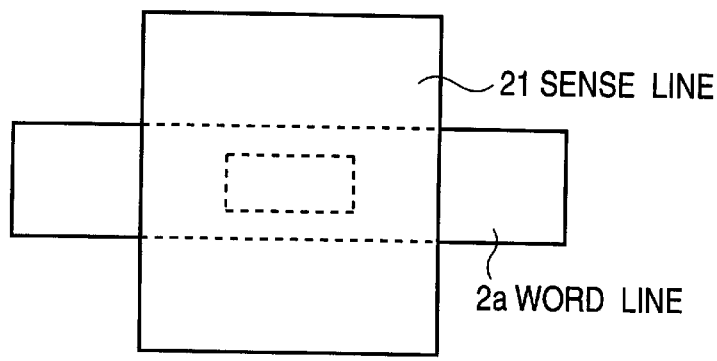

Referring to FIGS. 4A and 4B, the structure of the memory cell 21a is illustrated. FIG. 4A is a diagrammatic sectional view of the memory cell, and FIG. 4B is a diagrammatic plan view of the memory cell. The other memory cells 21b, 21c, 22a, 22b and 22c and the reference cells 21ra, 21rb, 21rc, 22ra, 22rb and 22rc have the same structure as that of the memory cell 21a.

The memory cell 21a includes a first ferromagnetic layer 81 and a second ferromagnetic layer 82 which are separated by an insulator film 83. Namely, the first ferromagnetic layer 81, the insulator film 83 and the second ferromagnetic layer 82 are stacked in the named order on the word line 2a formed on a substrate 1. An interlayer insulator film 84 is formed to cover the insulator film 83, and the second ferromagnetic layer 82 is formed on the insulator film 83 in an opening formed in the interlayer insulator film 84. The sense line 21 is formed on the interlayer insulator film 84, in contact with the second ferromagnetic layer 82 within the opening formed in the interlayer insulator film 84.

The first ferromagnetic layer 81 and the second ferromagnetic layer 82 are formed of a ferromagnetic material, exemplified by Ni—Fe—Co, and the insulator film 83 is formed of for example $Al_2O_3$. A spin-polarized tunneling element is constituted of a stacked assembly consisting of the first ferromagnetic layer 81, the insulator film 83 and the second ferromagnetic layer 82.

Information can be written into the first ferromagnetic layer 81 and the second ferromagnetic layer 82, by flowing a current through the word line and a current through the sense line so that a composite magnetic field generated by these currents reverses the direction of the magnetization vector in the ferromagnetic layers 81 and 82. On the other hand, information stored in the memory cell 21a is read out by detecting a voltage or a voltage drop between the word line 2a and the sense line 21.

Figure 5:
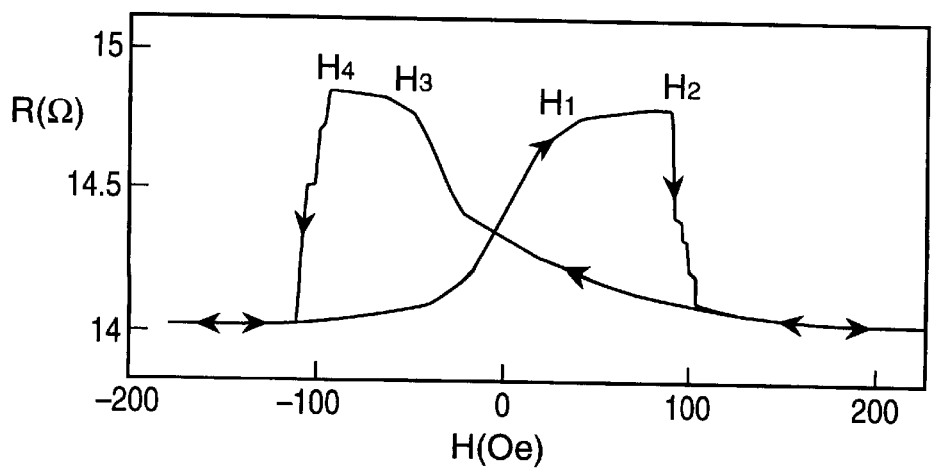
FIG. 5 is a graph illustrating a relation of a resistance-to-magnetic field of the magneto-resistive element.

Referring to FIG. 5, there is shown a graph illustrating a relation between a resistance of the memory cell (which corresponds to an output voltage) and a magnetic field applied to the same memory cell. The axis of abscissas indicates the direction and the strength of the magnetic field applied to the memory cell 21a, and the axis of ordinates designates a resistance value of the memory cell 21a. As shown in FIG. 5, the relation of the resistance of the memory cell and the applied magnetic field shows a hysteresis characteristics. In a zero magnetic field (no applied magnetic field), the resistance value of the memory cell 21 assumes the same value independently of the changing direction of the magnetic field. If the magnetic field increases from zero to $H_1$, the direction of magnetization is caused to rotate in only one ferromagnetic layer of the two ferromagnetic layers in the memory cell, by the composite magnetic field, so that the directions of magnetization in the two ferromagnetic layers become opposite to each other, with the result that the resistance increases. If the magnetic field increases from $H_1$ to $H_2$, the direction of magnetization is caused to rotate in the other ferromagnetic layer in which the direction of magnetization had not yet rotated when the magnetic field increased from zero to $H_1$, with the result that the resistance decreases at $H_2$. When a magnetic field of the opposite direction is applied, similar phenomena occur at the magnetic fields of zero, $H_3$, and $H_4$.

Now, a manner for writing information into the memory cell 21a and the reference cell 21ra will be described.

In order to select the sense lines 21 and 21r, the switch transistors 131, 141, 132 and 142 are brought into a conducting condition by the row decoders 102 and 103. Furthermore, in order to select the word line 2a, the switch transistors 111 and 121 are brought into a conducting condition by the column decoders 104 and 105. When a binary information "1" is to be written into the memory cell 21a and a binary information "0" is to be written into the reference cell 21ra, sense currents 92 and 103 and a word current 91 are caused to flow through the sense lines 21 and 21r and the word line 2a, respectively. To the contrary, when a binary information "0" is to be written into the memory cell 21a and a binary information "1" is to be written into the reference cell 21ra, sense currents 93 and 102 and the word current 91 are caused to flow through the sense lines 21 and 21r and the word line 2a, respectively. Here, the current directions of the sense currents 93 and 102 are opposite to the current directions of the sense currents 92 and 103, respectively, and on the other hand, the word current 91 is of the same direction.

Next, a manner for reading information from the memory cell 21a and the reference cell 21ra will be described.

In order to select the sense lines 21 and 21r and the word line 2a, the switch transistors 131, 132 and 121 are brought into a conducting condition. The other switch transistors including the switch transistors 141, 142 and 111 are maintained in an off condition. Then, a constant current is caused to flow through the memory cell 21a and the reference cell 21ra, for example, by grounding the word line 2a within the column decoder 105. A sense current Is flows through the transistor 131, the sense line 21, the memory cell 21a, the word line 2a and the transistor 121 between the row decoder 102 and the column decoder 105. On the other hand, a reference sense current Ir flows through the transistor 132, the sense line 21r, the reference cell 21ra, the word line 2a and the transistor 121 between the row decoder 102 and the column decoder 105. In this condition, the switch transistors 151 and 152 are brought into a conducting condition and the switch transistors 151 and 152 are maintained in an off condition, so that sense line side potentials of the memory cell 21a and the reference cell 21ra are detected by the comparator 107. This detection is based on the principle of a so-called four-probe method for measuring an electrical conductivity, in which a path for flowing the electric current and a path for detecting the voltage are provided on a sample separately from each other.

As mentioned above, since the memory cell 21a and the reference cell 21ra are located geographically adjacent to each other, the influence of variation in the wiring resistance (depending upon a geographical location on the same wafer) is small, and therefore, the sense line side potentials of the memory cell 21a and the reference cell 21ra detected by the comparator 107 are in proportion to the respective resistance values of the memory cell 21a and the reference cell 21ra. Thus, a binary information discriminated on the basis of the difference between the potentials applied to the comparator 107, is outputted from the comparator 107 to a bit line 26.

Figure 1:
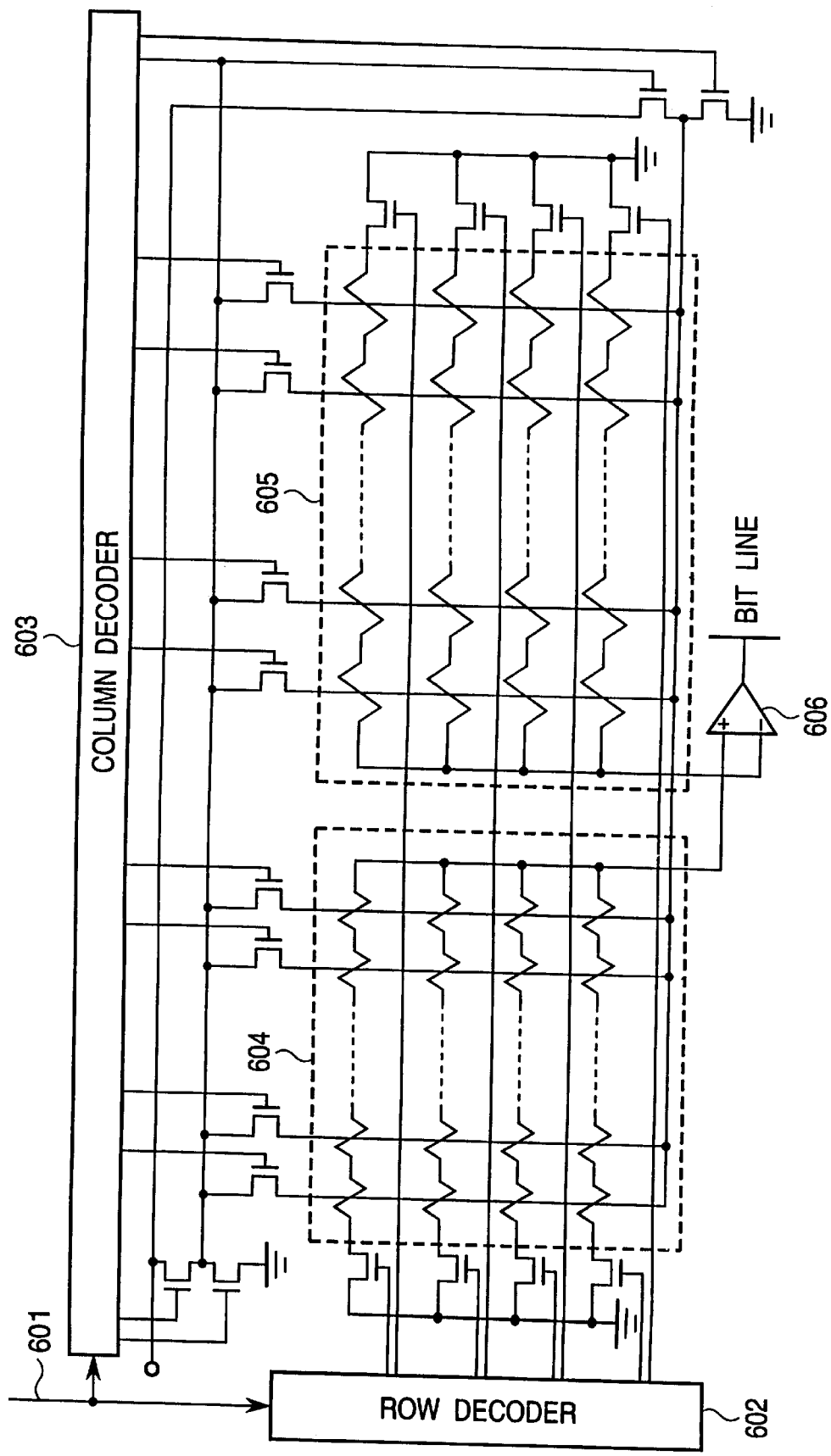
FIG. 1 is a circuit diagram of a layout diagram of a simplified MRAM circuit which includes a number of memory cells configured to utilize the GMR effect.
Figure 2:
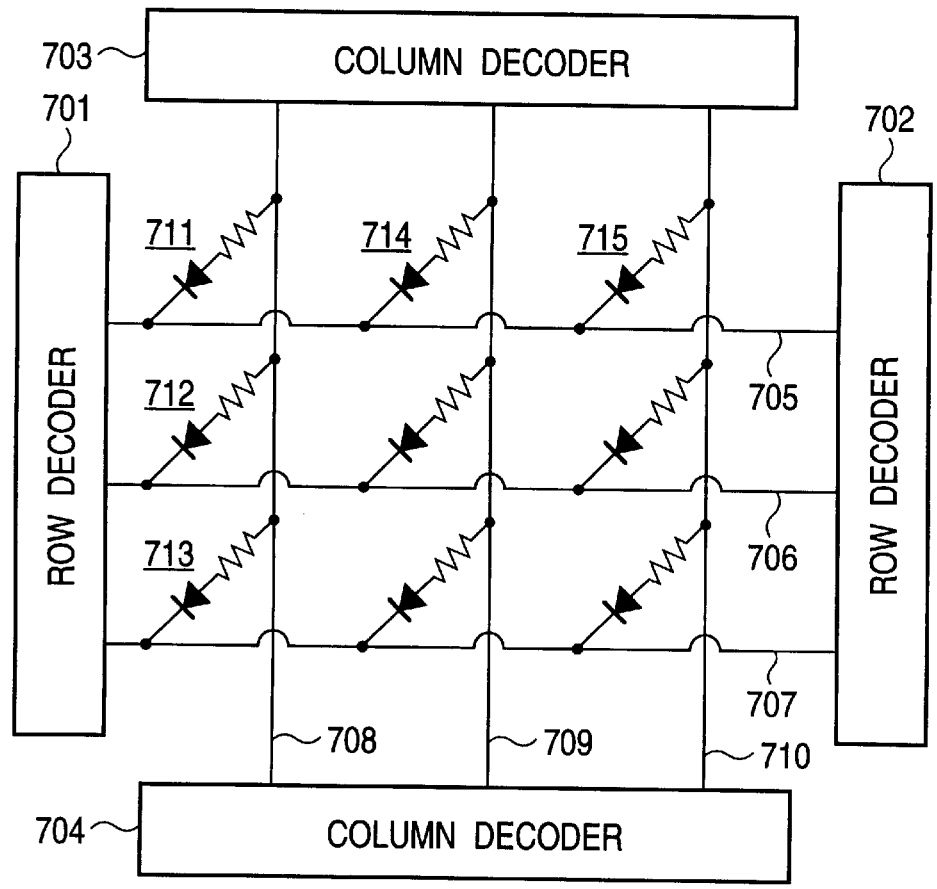
FIG. 2 is a circuit diagram of a MRAM circuit which includes a number of memory cells configured to utilize the MTJ effect.
Figure 6:
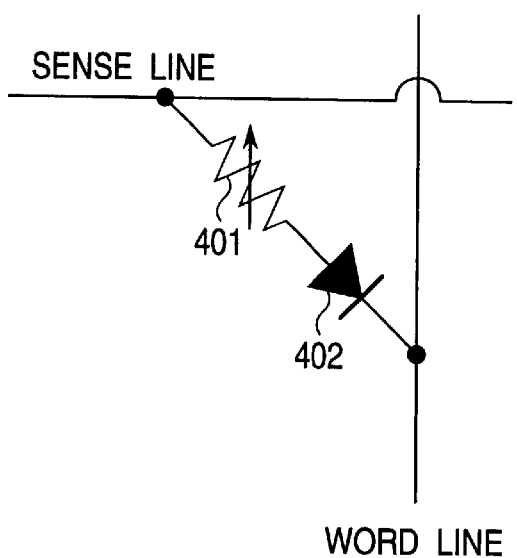
FIG. 6 is an equivalent circuit of a memory cell consisting of a magneto-resistive element and a diode connected in series.

Incidentally, if the memory cell is constituted of a spin-polarized tunneling element 401 and a diode 402 which are connected in series between a sense line and a word line, as shown in FIG. 6, selectivity in the memory cells is further elevated. The reason for this is that it is possible to reduce influence of a non-selected memory cell to a selected memory cell, which is caused by a current flowing through the non-selected memory cell.

Second Embodiment

Figure 7:
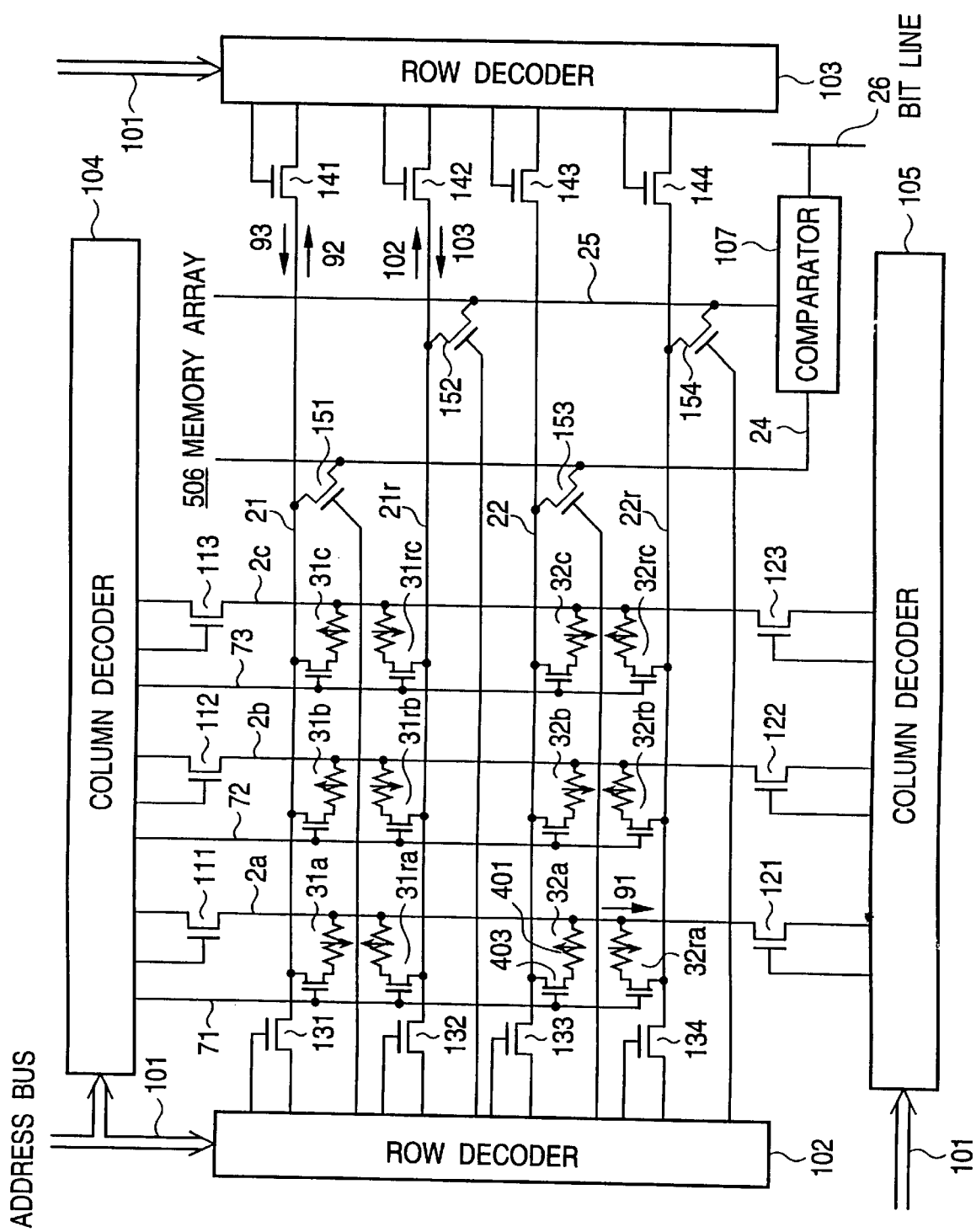
FIG. 7 is a layout diagram of a second embodiment of the MRAM circuit in accordance with the present invention.

Referring to FIG. 7, there is shown a layout diagram of a second embodiment of the MRAM circuit in accordance with the present invention. In FIG. 7, elements corresponding to those shown in FIG. 3 are given the same reference numbers, and a detailed explanation thereof will be omitted for simplification of the description.

The shown MRAM circuit includes a memory (cell) array 506, a decoder set and a comparator 107. The memory array 506 includes a number of memory cells 31a, 31b, 31c, 32a, 32b and 32c and a number of reference cells 31ra, 31rb, 31rc, 32ra, 32rb and 32rc which are paired with the number of memory cells, respectively. Each of the memory cells and the reference cells is constituted of a spin-polarized tunneling element 401 and a pass transistor 403 connected in series connected between a sense line and a word line. Each pass transistor is on-off controlled by a corresponding control line 71, 72 or 73 which extends from the column decoder 104 and which is connected to a gate of the pass transistor. The memory cells and the reference cells are located at intersections of word lines 2a, 2b and 2c and sense lines 21, 21r, 22 and 22r, similarly to the first embodiment. In this MRAM circuit, one bit of information is stored in two spin-polarized tunneling elements (one memory cell and one reference cell), similarly to the first embodiment.

The manner for writing information into the memory cell 31a and the reference cell 31ra is the same as that in the first embodiment, and therefore, explanation will be omitted.

Now, a manner for reading information from the memory cell 31a and the reference cell 31ra will be described briefly.

In order to select the sense lines 21 and 21r and the word line 2a, the switch transistors 131, 132 and 121 are brought into a conducting condition. Then, the control line 71 is brought to a high level so as to bring the cell pass transistors connected to the control line 71 into a conducting condition. Furthermore, a constant current is caused to flow through the memory cell 31a and the reference cell 31ra. A sense current Is flows through the transistor 131, the sense line 21, the memory cell 31a, the word line 2a and the transistor 121 between the row decoder 102 and the column decoder 105. On the other hand, a reference sense current Ir flows through the transistor 132, the sense line 21r, the reference cell 31ra, the word line 2a and the transistor 121 between the row decoder 102 and the column decoder 105. In this condition, the switch transistors 151 and 152 are brought into a conducting condition, so that sense line side potentials of the memory cell 31a and the reference cell 31ra are detected by the comparator 107. This detection is based on the principle of the so-called four-probe method, similarly to the first embodiment.

As mentioned above, since the memory cell 31a and the reference cell 31ra are located geographically adjacent to each other, the influence of variation in the wiring resistance is small, and therefore, the sense line side potentials of the memory cell 31a and the reference cell 31ra detected by the comparator 107 are in proportion to the respective resistance values of the memory cell 31a and the reference cell 31ra. Thus, a binary information discriminated on the basis of the difference between the potentials applied to the comparator 107, is outputted from the comparator 107 to a bit line 26.

Third Embodiment

Figure 8:
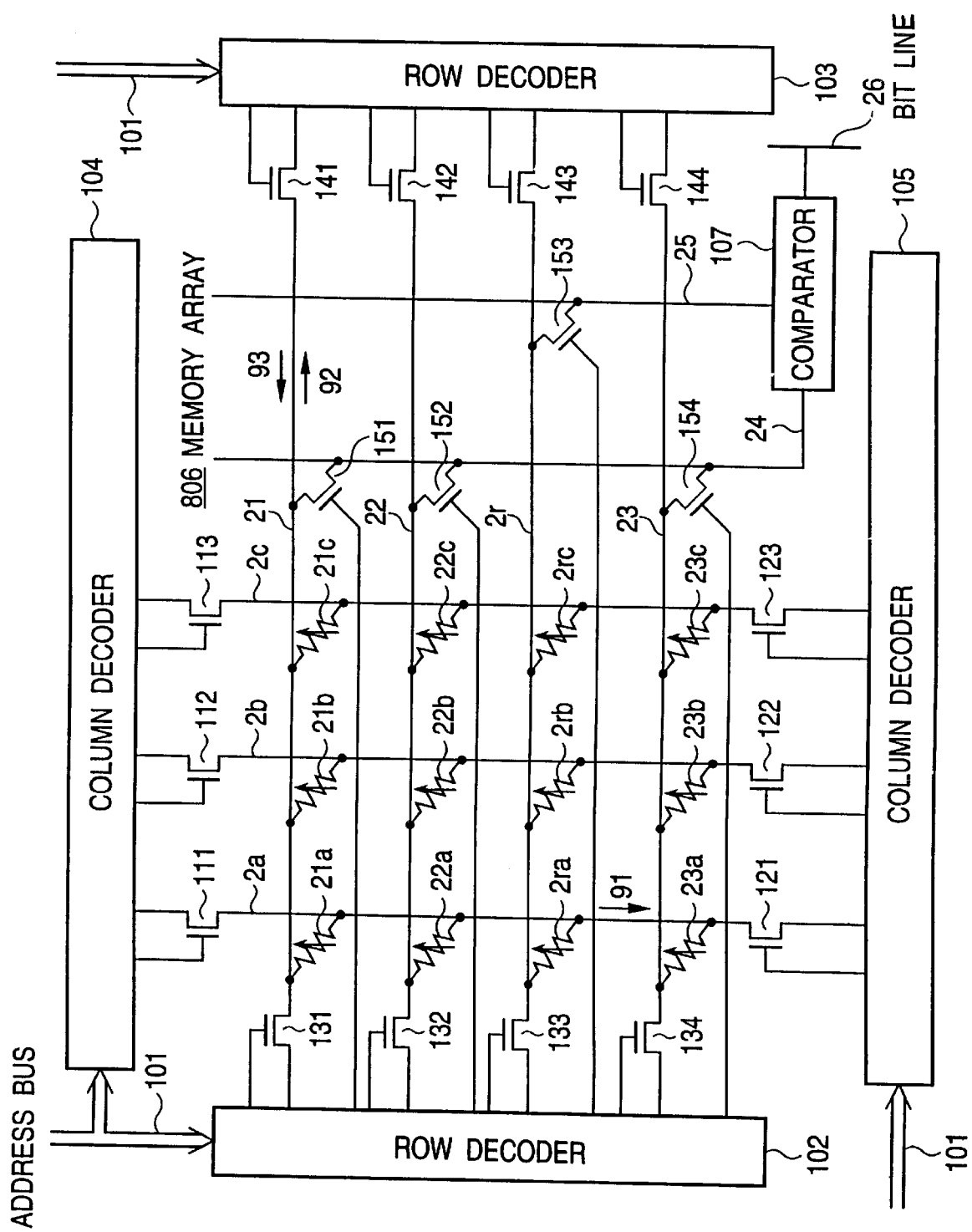
FIG. 8 is a layout diagram of a third embodiment of the MRAM circuit in accordance with the present invention.

Referring to FIG. 8, there is shown a layout diagram of a third embodiment of the MRAM circuit in accordance with the present invention. In FIG. 8, elements similar in function to those shown in FIG. 3 are given the same reference numbers.

The shown MRAM circuit includes a memory (cell) array 806, a decoder set and a comparator 107. The memory array 806 includes a number of memory cells 21a, 21b, 21c, 22a, 22b, 22c, 23a, 23b and 23c and a number of reference cells 2ra, 2rb and 2rc. The memory cells and the reference cells are located at intersections of word lines 2a, 2b and 2c and sense lines 21, 22, 2r and 23, as shown in FIG. 8.

The decoder set includes a pair of row decoders 102 and 103 and a pair of column decoders 104 and 105, which are coupled to an address bus 101 in such a manner each of the row decoders 102 and 103 receives and decodes a first part of an address supplied through the address bus 101, and each of the column decoders 104 and 105 receives and decodes a second part (namely, the remaining part) of the address supplied through the address bus 101.

Similarly to the first embodiment, the column decoder 104 includes switch transistors 111, 112 and 113, and the column decoder 105 includes switch transistors 121, 122 and 123. In brief, current terminals of the column decoder 104 are connected to one end of the switch transistors 111, 112 and 113, respectively, the other end of which are connected to one end of the word lines 2a, 2b and 2c, respectively. A control gate of the switch transistors 111, 112 and 113 are connected to control outputs of the column decoder 104, respectively. Furthermore, current terminals of the column decoder 105 are connected to one end of the switch transistors 121, 122 and 123, respectively, the other end of which are connected to the other end of the word lines 2a, 2b and 2c, respectively. A control gate of the switch transistors 121, 122 and 123 are connected to control outputs of the column decoder 105, respectively. Thus, these column decoders decode the first part of the address supplied through the address bus, and on-off control these switch transistors on the basis of the result of the decoding, so as to selectively bring the word lines 2a, 2b and 2c into either a writing condition or a ground level condition. In the writing condition, an electric current is caused to flow through the selected word line in a direction of the arrow 91.

The row decoder 102 includes switch transistors 131, 132, 133 and 134, and the row decoder 103 includes switch transistors 141, 142, 143 and 144. In brief, current terminals of the row decoder 102 are connected to one end of the switch transistors 131, 132, 133 and 134, respectively, the other end of which are connected to one end of the sense lines 21, 22, 2r and 23, respectively. A control gate of the switch transistors 131, 132, 133 and 134 are connected to control outputs of the row decoder 102, respectively. Furthermore, current terminals of the row decoder 103 are connected to one end of the switch transistors 141, 142, 143 and 144, respectively, the other end of which are connected to the other end of the sense lines 21, 22, 2r and 23, respectively. A control gate of the switch transistors 141, 142, 143 and 144 are connected to control outputs of the row decoder 103, respectively. Thus, these row decoders decode the second part of the address supplied through the address bus, and on-off control these switch transistors on the basis of the result of the decoding, so as to selectively bring the sense lines 21, 22, 2r and 23 into either a writing condition or a ground level condition. In the writing condition, an electric current is caused to flow through a selected sense line either in a direction of the arrow 92 or in an opposite direction of the arrow 93.

One end of a subsidiary line (sense line) 24 is connected through pass transistors 151, 152 and 154 to the sense lines 21, 22 and 23, respectively. The other end of the subsidiary line (sense line) 24 is connected to a non-inverted input of the comparator 107. One end of a subsidiary line (sense line) 25 is connected through a pass transistor 153 to the sense line 2r. The other end of the subsidiary line (sense line) 25 is connected to an inverted input of the comparator 107. A control gate of these pass transistors 151, 152, 153 and 154 are connected to control terminals of the row decoder 102, so that the pass transistors 151, 152, 153 and 154 are selectively on-off controlled by the row decoder 102.

As mentioned above, the cells given with the reference numbers 21a, 21b, 21c, 22a, 22b, 22c, 23a, 23b and 23c, are the memory cells, and the cells given with the reference numbers 2ra, 2rb and 2rc, are the reference cells. As shown in the drawing, since one row of reference cells are located geographically near to rows of memory cells, it is possible to minimize influence of variation in a wiring resistance depending upon a geographical location on the same wafer.

Similarly to the first embodiment, each of the memory cells 21a, 21b, 21c, 22a, 22b, 22c, 23a, 23b and 23c and reference cells 2ra, 2rb and 2rc has the construction shown in FIGS. 4A and 4B, and the characteristics shown in FIG. 5.

Now, a manner for writing information into the memory cell 21a will be described.

In order to select the sense line 21, the switch transistors 131 and 141 are brought into a conducting condition by the row decoders 102 and 103. Furthermore, in order to select the word line 2a, the switch transistors 111 and 121 are brought into a conducting condition by the column decoders 104 and 105. When a binary information "1" is to be written into the memory cell 21a, a sense current 92 and a word current 91 are caused to flow through the sense line 21 and the word line 2a, respectively. To the contrary, when a binary information "0" is to be written into the memory cell 21a, a sense current 93 and the word current 91 are caused to flow through the sense line 21 and the word line 2a, respectively. Here, the sense current 93 is opposite in direction to the sense current 92, and on the other hand, the word current 91 is of the same direction. The other memory cells can be written in a similar manner.

In addition, by a manner similar to the manner for writing information into the memory cell 21a, the reference cells 2ra, 2rb and 2rc are written or magnetized to a predetermined level so that the reference cell has an intermediate resistance value between a minimum resistance value that the memory cell can assume and a maximum resistance value that the memory cell can assume.

Next, a manner for reading information from the memory cell 21a will be described.

In order to select the sense lines 21 and 2r and the word line 2a, the switch transistors 131, 133 and 121 are brought into a conducting condition. Then, a constant current is caused to flow through the memory cell 21a and the reference cell 2ra. A sense current Is flows through the transistor 131, the sense line 21, the memory cell 21a, the word line 2a and the transistor 121 between the row decoder 102 and the column decoder 105. On the other hand, a reference sense current Ir flows through the transistor 133, the sense line 2r, the reference cell 2ra, the word line 2a and the transistor 121 between the row decoder 102 and the column decoder 105. In this condition, the switch transistors 151 and 153 are brought into a conducting condition, so that sense line side potentials of the memory cell 21a and the reference cell 2ra are detected by the comparator 107. This detection is based on the principle of the so-called four-probe method, similar to the first embodiment.

As mentioned above, since the memory cell 21a and the reference cell 21ra are located geographically near to each other, the influence of variation in the wiring resistance (depending upon a geographical location on the same wafer) is small, and therefore, the sense line side potentials of the memory cell 21a and the reference cell 2ra detected by the comparator 107 are in proportion to the respective resistance values of the memory cell 21a and the reference cell 2ra. Thus, a binary information discriminated on the basis of the difference between the potentials applied to the comparator 107, is outputted from the comparator 107 to a bit line 26. Here, as mentioned above, since the reference cell has the intermediate resistance value between a minimum resistance value that the memory cell can assume and a maximum resistance value that the memory cell can assume, the information stored in the memory cell can clearly distinguishably be read out by the comparator 107, regardless of whether the memory cell stores the a binary information "1" or the a binary information "0".

Incidentally, similar to the first embodiment, if the memory cell is constituted of a spin-polarized tunneling element 401 and a diode 402 which are connected in series between a sense line and a word line, as shown in FIG. 6, selectivity in the memory cells is further elevated. The reason for this is that it is possible to reduce influence of a non-selected memory cell to a selected memory cell, which is caused by a current flowing through the non-selected memory cell.

Fourth Embodiment

Figure 9:
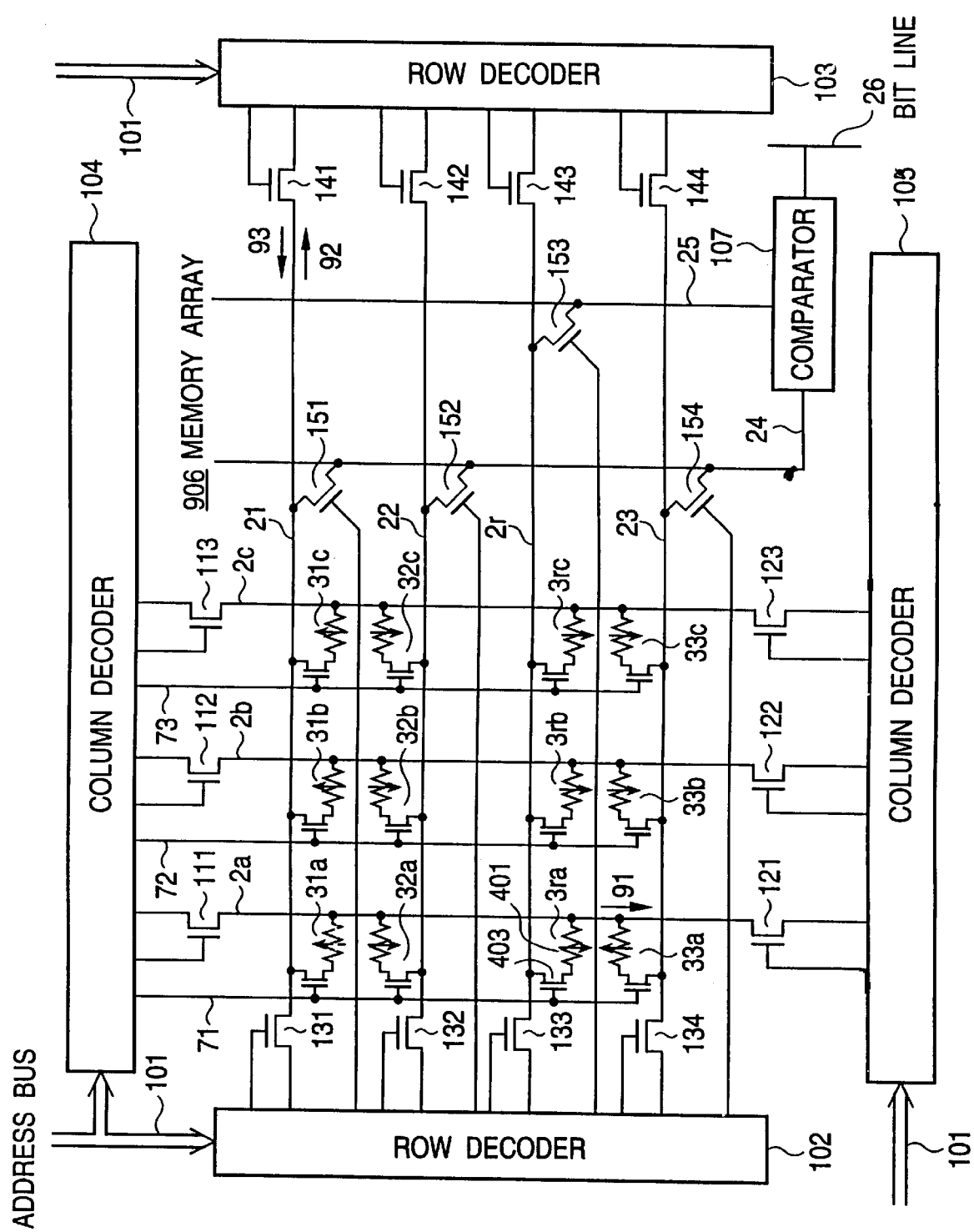
FIG. 9 is a layout diagram of a fourth embodiment of the MRAM circuit in accordance with the present invention.

Referring to FIG. 9, there is shown a layout diagram of a fourth embodiment of the MRAM circuit in accordance with the present invention. In FIG. 9, elements corresponding to those shown in FIG. 8 are given the same reference numbers, and a detailed explanation thereof will be omitted for simplification of the description.

The shown MRAM circuit includes a memory (cell) array 906, a decoder set and a comparator 107. The memory array 906 includes a number of memory cells 31a, 31b, 31c, 32a, 32b, 32c, 33a, 33b and 33c and a number of reference cells 3ra, 3rb and 3rc which are paired with the number of memory cells, respectively. Each of the memory cells and the reference cells is constituted of a spin-polarized tunneling element 401 and a pass transistor 403 connected in series connected between a sense line and a word line. Each pass transistor is on-off controlled by a corresponding control line 71, 72 or 73 which extends from the column decoder 104 and which is connected to a gate of the pass transistor. The memory cells and the reference cells are located at intersections of word lines 2a, 2b and 2c and sense lines 21, 22, 2r and 23, similarly to the third embodiment.

The manner for writing information into the memory cell 31a is the same as that in the third embodiment, and therefore, explanation will be omitted.

Now, a manner for reading information from the memory cell 31a will be described briefly.

In order to select the sense lines 21 and 2r and the word line 2a, the switch transistors 131, 133 and 121 are brought into a conducting condition. Then, the control line 71 is brought to a high level so as to bring the cell pass transistors connected to the control line 71 into a conducting condition. Furthermore, a constant current is caused to flow through the memory cell 31a and the reference cell 3ra. A sense current Is flows through the transistor 131, the sense line 21, the memory cell 31a, the word line 2a and the transistor 121 between the row decoder 102 and the column decoder 105. On the other hand, a reference sense current Ir flows through the transistor 133, the sense line 2r, the reference cell 3ra, the word line 2a and the transistor 121 between the row decoder 102 and the column decoder 105. In this condition, the switch transistors 151 land 153 are brought into a conducting condition, so that sense line side potentials of the memory cell 31a and the reference cell 3ra are detected by the comparator 107. This detection is based on the principle of the so-called four-probe method, similarly to the third embodiment.

As mentioned above, since the memory cell 31a and the reference cell 3ra are located geographically near to each other, the influence of variation in the wiring resistance is small, and therefore, the sense line side potentials of the memory cell 31a and the reference cell 3ra detected by the comparator 107 are in proportion to the respective resistance values of the memory cell 31a and the reference cell 3ra. Thus, binary information discriminated on the difference between the potentials applied to the comparator 107, is outputted from the comparator 107 to a bit line 26.

In the above mentioned third and fourth embodiments, only the one row of reference cells are provided in the MRAM circuit. However, one row of reference cells can be provided for each a predetermined number of rows of memory cells, so that a plurality of rows of reference cells are provided in the whole of the MRAM circuit.

As mentioned above, the MRAM circuit in accordance with the present invention is characterized in that each memory cell and its corresponding reference cell are located near to each other, and therefore, the MRAM circuit can have a stable characteristics, since it is possible to avoid influence of variation in characteristics of magneto-resistive elements and variation in a wiring resistance, depending upon a geographical location on a wafer.

In addition, by using the voltage sensing method based on the principle of the four-probe method, it is possible to read information with high sensitivity by excluding influence of variation of the wiring resistance.

Furthermore, even if the wiring conductors are microminiaturized with the result that the wiring resistance increases, since the influence of variation of the wiring resistance is small, it is possible to elevate the integration density of the MRAM circuit.

The invention has thus been shown and described with reference to the specific embodiments. However, it should be noted that the present invention is in no way limited to the details of the illustrated structures but changes and modifications may be made within the scope of the appended claims.

What is claimed is:

1. A magnetic random access memory circuit comprising:

a row decoding means receiving a part of a given address;

a column decoding means receiving the other part of a given address;

a plurality of pairs of sense lines connected to output terminals of said row decoding means, each pair of sense lines being located adjacent to each other;

a plurality of word lines connected to output terminals of said column decoding means, said word lines extending to intersect said sense lines so that intersections of said sense lines and said word lines are located in the form of a matrix;

a memory array including a plurality of cell pairs distributed over said matrix, each cell pair including a memory cell and a reference cell located adjacent to each other, each of said memory cell and said reference cell including a magneto-resistive element;

said memory cell and said reference cell of each cell pair being located at intersections of one word line and one pair of sense lines, respectively, said memory cell of said each cell pair being connected between one sense line of said one pair of sense lines and said one word line, and said reference cell of said each cell pair being connected between the other sense line of said one pair of sense lines and said one word line.

2. A magnetic random access memory circuit claimed in claim 1 wherein each of said memory cell and said reference cell includes a diode connected in series to said magneto-resistive element, one end of a series circuit formed of said diode and said magneto-resistive element being connected to a corresponding sense line, and the other end of said series circuit formed of said diode and said magneto-resistive element being connected to a corresponding word line.

3. A magnetic random access memory circuit claimed in claim 1 wherein each of said memory cell and said reference cell includes a pass transistor connected in series to said magneto-resistive element, one end of a series circuit formed of said pass transistor and said magneto-resistive element being connected to a corresponding sense line, and the other end of said series circuit formed of said pass transistor and said magneto-resistive element being connected to a corresponding word line, said pass transistor being on-off controlled by said row decoding means.

4. A magnetic random access memory circuit claimed in claim 1 wherein said row decoding means includes a pair of row decoders each receiving said part of a given address, and said column decoding means includes a pair of column decoders each receiving the other part of a given address, each of said sense lines being connected between one output of plural outputs of one row decoder of said pair of row decoders and a corresponding output of plural outputs of the other row decoder of said pair of row decoders, each of said word lines being connected between one output of plural outputs of one column decoder of said pair of column decoders and a corresponding output of plural outputs of the other column decoder of said pair of column decoders.

5. A magnetic random access memory circuit claimed in claim 4 wherein in a writing operation, said pair of row decoders supply one selected pair of sense lines with an electric current which flows in a direction corresponding to the value of a binary information to be written, and said pair of column decoders supply an electric current of a predetermined direction regardless of the value of said binary information to be written, in a selected word line of said word lines.

6. A magnetic random access memory circuit claimed in claim 1 wherein in a reading operation, said row decoding means and said column decoding means flow the same current in said memory cell and said reference cell of a selected cell pair to be read out.

7. A magnetic random access memory circuit claimed in claim 6 further including a comparing means for comparing a potential at a sense line side terminal of said memory cell of said selected cell pair with a potential of a sense line side terminal of said reference cell of said selected cell pair.

8. A magnetic random access memory circuit claimed in claim 7 wherein said comparing means includes a comparator having a non-inverted input and an inverted input, first and second subsidiary lines connected to said non-inverted input and said inverted input of said comparator, respectively, a plurality of first switch transistors each having one end connected in common to said first subsidiary line and the other end connected to one sense line of a corresponding one pair of sense lines, and a plurality of second switch transistors each having one end connected in common to said second subsidiary line and the other end connected to the other sense line of said corresponding one pair of sense lines, said plurality of first switch transistors and said plurality of second switch transistors being on-off controlled by said row decoding means.

9. A magnetic random access memory circuit claimed in claim 1 further including a first means for flowing a current in said memory cell and said reference cell of a selected cell pair in a reading operation, and a second means for comparing a voltage drop in said memory cell of said selected cell pair with a voltage drop of said reference cell of said selected cell pair.

10. A magnetic random access memory circuit claimed in claim 1 wherein said magneto-resistive element is constituted of a spin-polarized tunneling element.

11. A magnetic random access memory circuit comprising:
a row decoding means receiving a part of a given address;
a column decoding means receiving the other part of a given address;
a plurality of sense lines connected to output terminals of said row decoding means;
a plurality of word lines connected to output terminals of said column decoding means, said word lines extending to intersect said sense lines so that intersections of said sense lines and said word lines are located in the form of a matrix;
a memory array including a plurality of memory cells and a plurality of reference cells distributed over said matrix and located said intersections of said sense lines and said word lines, said plurality of reference cells being located along at least one predetermined sense line of said sense lines and connected at its one end in common to said at least one predetermined sense line and at its other end to said word lines, respectively, said plurality of memory cells being located along the other sense lines of said sense lines, said memory cells located along each sense line of the other sense lines being connected at its one end in common to said each sense line and at its other end to said word lines, respectively,
each of said memory cells and said reference cells including a magneto-resistive element.

12. A magnetic random access memory circuit claimed in claim 11 wherein each of said memory cells and said reference cells includes a diode connected in series to said magneto-resistive element, one end of a series circuit formed of said diode and said magneto-resistive element being connected to a corresponding sense line, and the other end of said series circuit formed of said diode and said magneto-resistive element being connected to a corresponding word line.

13. A magnetic random access memory circuit claimed in claim 11 wherein each of said memory cells and said reference cells includes a transistor connected in series to said magneto-resistive element, one end of a series circuit formed of said pass transistor and said magneto-resistive element being connected to a corresponding sense line, and the other end of said series circuit formed of said pass transistor and said magneto-resistive element being connected to a corresponding word line, said pass transistor being on-off controlled by said row decoding means.

14. A magnetic random access memory circuit claimed in claim 11 wherein said row decoding means includes a pair of row decoders each receiving said part of a given address, and said column decoding means includes a pair of column decoders each receiving the other part of a given address, each of said sense lines being connected between one output of plural outputs of one row decoder of said pair of row decoders and a corresponding output of plural outputs of the other row decoder of said pair of row decoders, each of said word lines being connected between one output of plural outputs of one column decoder of said pair of column decoders and a corresponding output of plural outputs of the other column decoder of said pair of column decoders.

15. A magnetic random access memory circuit claimed in claim 4 wherein in a writing operation, said pair of row decoders supply a selected sense line of said sense lines with an electric current which flows in a direction corresponding to the value of a binary information to be written, and said pair of column decoders supply an electric current of a predetermined direction regardless of the value of said binary information to be written, in a selected word line of said word lines.

16. A magnetic random access memory circuit claimed in claim 11 wherein in a reading operation, said row decoding means and said column decoding means flow the same current in a selected memory cell at an interconnection of a selected one of said sense lines other than said at least one predetermined sense line and a selected one of said word lines, and a selected reference cell at an interconnection of said at least one predetermined sense line of said sense lines and said selected one of said word lines.

17. A magnetic random access memory circuit claimed in claim 6 further including a comparing means for comparing a potential at a sense line side terminal of said selected memory cell with a potential of a sense line side terminal of said selected reference cell.

18. A magnetic random access memory circuit claimed in claim 7 wherein said comparing means includes a comparator having a non-inverted input and an inverted input, first and second subsidiary lines connected to said non-inverted input and said inverted input of said comparator, respectively, a plurality of first switch transistors each having one end connected in common to said first subsidiary line and the other end connected to a corresponding one of said sense lines other than said at least one predetermined sense line, and at least one second switch transistor having one end connected to said second subsidiary line and the other end connected to said at least one predetermined sense line, said plurality of first switch transistors and said at least one second switch transistor being on-off controlled by said row decoding means.

19. A magnetic random access memory circuit claimed in claim 11 further including a first means for flowing a current in a selected memory cell at an interconnection of a selected one of said sense lines other than said at least one predetermined sense line and a selected one of said word lines, and a selected reference cell at an interconnection of said at least one predetermined sense line of said sense lines and said selected one of said word lines, and a second means for comparing a voltage drop in said selected memory cell with a voltage drop of said selected reference cell.

20. A magnetic random access memory circuit claimed in claim 11 wherein said magneto-resistive element is constituted of a spin-polarized tunneling element.

* * * * *